(12) United States Patent
Kang et al.

(10) Patent No.: US 7,942,968 B2
(45) Date of Patent: May 17, 2011

(54) CATALYST ENHANCED CHEMICAL VAPOR DEPOSITION APPARATUS

(75) Inventors: Hee Cheol Kang, Yongin (KR); Kazuo Furuno, Yongin (KR); Han Ki Kim, Yongin (KR); Myoung Soo Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1029 days.

(21) Appl. No.: 11/413,927

(22) Filed: Apr. 28, 2006

(65) Prior Publication Data

US 2006/0254514 A1 Nov. 16, 2006

(30) Foreign Application Priority Data

May 11, 2005 (KR) .................. 10-2005-0039535

(51) Int. Cl.
C23C 16/44 (2006.01)
C23F 1/00 (2006.01)
H01L 21/306 (2006.01)
C23C 16/06 (2006.01)
C23C 16/22 (2006.01)

(52) U.S. Cl. ..................... 118/715; 156/345.1

(58) Field of Classification Search .......... 118/715; 156/345.1
See application file for complete search history.

(56) References Cited

U.S. PATENT DOCUMENTS

| | | | |
|---|---|---|---|
| 4,977,855 A * | 12/1990 | Ohmi et al. ............. | 118/722 |
| 5,160,544 A | 11/1992 | Garg et al. | |
| 6,593,548 B2 | 7/2003 | Matsumura et al. | |
| 6,709,512 B2 * | 3/2004 | Yamoto et al. ............. | 117/90 |
| 2004/0149211 A1 | 8/2004 | Ahn et al. | |
| 2007/0128861 A1 * | 6/2007 | Kim et al. ............. | 438/680 |

FOREIGN PATENT DOCUMENTS

| | | |
|---|---|---|
| JP | 2002-069648 | 3/2002 |
| JP | 2002-141293 | 5/2002 |
| JP | 2003-124133 | 4/2003 |
| JP | 2004-55651 | 2/2004 |
| JP | 2004-128322 | 4/2004 |
| JP | 2005-273094 | 10/2005 |
| WO | WO 02/25712 A1 | 3/2002 |

OTHER PUBLICATIONS

Patent Abstracts of Japan, Publication No. 2003-124133; Publication Date: Apr. 25, 2003; in the name of Shinraku et al.
Patent Abstracts of Japan, Publication No. 2004-055651; Publication Date: Feb. 19, 2004; in the name of Ikeda et al.
Patent Abstracts of Japan, Publication No. 2004-128322; Publication Date: Apr. 22, 2004; in the name of Ishibashi et al.

(Continued)

Primary Examiner — Rudy Zervigon
(74) Attorney, Agent, or Firm — Christie, Parker & Hale, LLP (57) ABSTRACT

A catalyst enhanced chemical vapor deposition (CECVD) apparatus is provided in which the showerhead and catalyst support are separated from each other. The CECVD apparatus has excellent spacing between the showerhead, catalyst wire and substrate and can be purged to prevent contaminants from forming on parts functioning at low temperatures. The CECVD apparatus comprises a reaction chamber, a showerhead for introducing reaction gas into the reaction chamber, a catalyst wire for decomposing the reaction gas, a catalyst support for supporting the catalyst wire, a substrate on which the decomposed gas is deposited, and a substrate support for supporting the substrate.

13 Claims, 5 Drawing Sheets

OTHER PUBLICATIONS

SIPO Office action dated Sep. 26, 2008 for corresponding China application 2006100801575 with English translation, indicating relevance of reference listed in the IDS.

Japanese Office action dated Jan. 27, 2009, for corresponding Japanese application 2005-298188, noting references listed in this IDS.

* cited by examiner

CATALYST ENHANCED CHEMICAL VAPOR DEPOSITION APPARATUS

CROSS-REFERENCE TO RELATED APPLICATIONS

This application claims priority to and the benefit of Korean Patent Application No. 2005-39535, filed May 11, 2005 in the Korean Intellectual Property Office, the entire content of which is incorporated herein by reference.

FIELD OF THE INVENTION

The present invention relates to a catalyst enhanced chemical vapor deposition (CECVD) apparatus, and more particularly, to a CECVD apparatus having a simplified structure comprising a showerhead and a catalyst support separated from each other. The CECVD apparatus has excellent separation between the showerhead, catalyst wire and substrate; and prevents contaminants from forming on parts functioning at low temperatures.

BACKGROUND OF THE INVENTION

In fabricating semiconductor devices, display devices, and the like, chemical vapor deposition (CVD) methods have been widely used to form thin films on substrates. CVD methods include plasma enhanced chemical vapor deposition (PECVD), thermal chemical vapor deposition, and the like. Plasma enhanced chemical vapor deposition (PECVD) forms films by decomposing and/or activating source gas in plasma. Thermal chemical vapor deposition forms films by heating substrates, thereby causing chemical reactions.

Another CVD method is "heating element CVD," which forms films by decomposing and/or activating source gas using a heating element maintained at a high temperature. A heating element CVD apparatus includes a vacuum chamber into which a source gas is introduced, and a heating element comprising a metal having a high melting point, such as tungsten or the like, maintained at a high temperature of about 1,000° C. to about 2,000° C. After introduction, the source gas is decomposed or activated as it passes through the surface of the heating element. Then, the decomposed or activated source gas reaches a substrate, depositing a thin film on the surface of the substrate. Hot wire CVD, which uses a wire-shaped heating element, is one example of a heating element CVD method. Another heating element CVD method, in which the heating element undergoes a catalytic reaction to decompose or activate the source gas, is catalyst enhanced chemical vapor deposition (CECVD).

In CECVD, the source gas is decomposed or activated when it passes through the surface of the catalyst, thereby advantageously lowering the temperature of the substrate. In comparison, thermal chemical vapor deposition uses only the heat of the substrate to cause the chemical reaction. Further, unlike PECVD, CECVD uses no plasma, thereby preventing damage to the substrate due to the plasma. Thus, CECVD is expected to emerge as a method of film growth for next generation semiconductor devices, display devices, and the like having improved integration and performance, and fine pitch.

Figure 1:
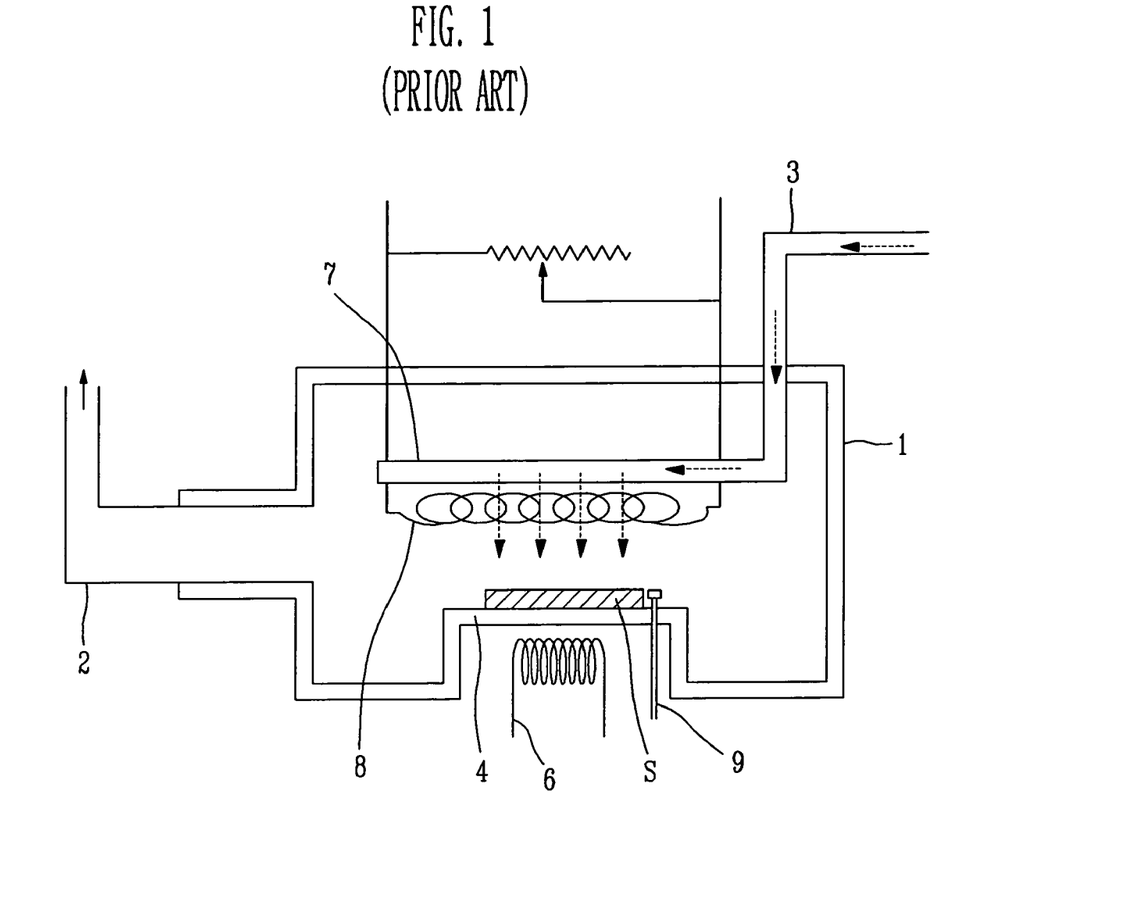
FIG. 1 is a schematic illustrating a catalyst enhanced chemical vapor deposition (CECVD) apparatus according to the prior art.

FIG. 1 is a schematic illustrating a CECVD apparatus according to the prior art. As shown in FIG. 1, the CECVD apparatus includes a chamber 1 having a side wall to which a vacuum pump (not shown) is connected through an exhaust pipe 2. The vacuum pump can exhaust the chamber 1, e.g., to a pressure of about $1 \times 10^{-6}$ Pa. Further, the chamber 1 is connected to a gas supply pipe 3, which supplies reaction gas for growing thin films to the chamber 1. A substrate S for growing a poly silicon layer is loaded through a loadlock chamber onto a substrate support 4 inside the chamber 1. The substrate support 4 can be a graphite susceptor coated with SiC, and is heated by a heater 6 located outside the chamber 1. A catalyst wire 8 is located between a showerhead 7 at the end of the gas supply pipe 3 and the substrate support 4. A thermocouple 9 is attached to the substrate support 4 for measuring the temperature of the substrate S.

Figure 2:
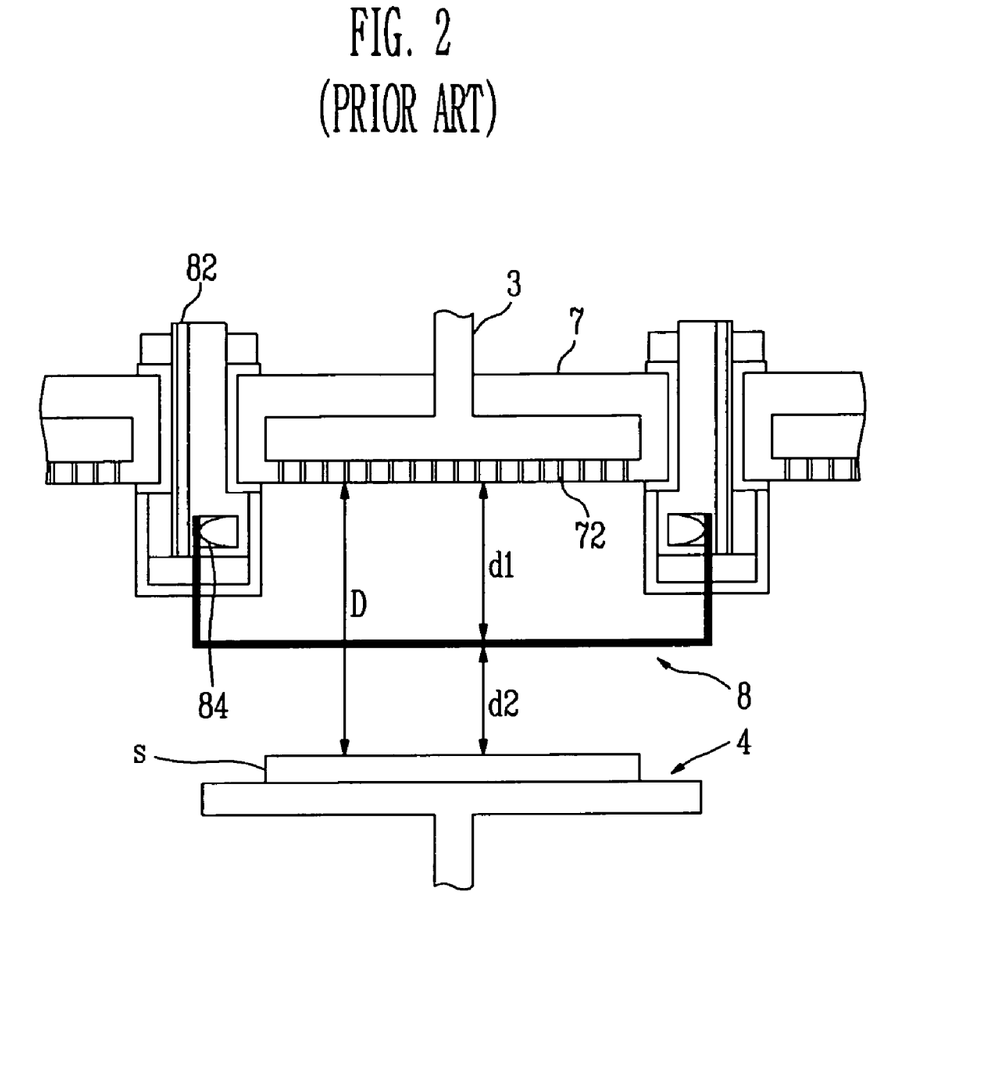
FIG. 2 is a cross-sectional view of the prior art CECVD apparatus of FIG. 1.

FIG. 2 is a cross sectional view of the CECVD apparatus illustrated in FIG. 1, including the catalyst wire, a catalyst support, the substrate support and the showerhead. As shown in FIG. 2, the CECVD apparatus according to the prior art includes a showerhead 7 which communicates with the gas supply pipe 3 and includes a plurality of injection holes 72 facing the inside of the chamber 1. The catalyst wire 8 adjoins the showerhead 7 and is supported by a catalyst support 84. Further, a gas line 82 supplies gas to the catalyst wire 8.

In such a CECVD apparatus, the catalyst wire 8 is adjacent to the shower head 7, and contaminants are not prevented from forming on parts of the catalyst wire 8 that function at low temperatures. Also, the gas line 82 for supplying gas to the catalyst wire 8 is provided in addition to the gas supply pipe 3 for supplying the reaction gas, thereby complicating the configuration of the showerhead 7. This construction makes it difficult to maintain the showerhead 7 and to supply the reaction gas uniformly in the chamber 1.

Further, this construction makes it very difficult to adjust the distance D between the showerhead 7 and the substrate S, the distance $d_1$ between the showerhead 7 and the catalyst wire 8, and the distance $d_2$ between the catalyst wire 8 and the substrate S. These distances, D, $d_1$, $d_2$, are important and are easily modified to adjust the introduction, decomposition, combination and exhaust of the reaction gas. Accordingly, to improve the reaction in the chamber, adjusting these distances is important.

SUMMARY OF THE INVENTION

In one embodiment of the present invention, a catalyst enhanced chemical vapor deposition (CECVD) apparatus has a simplified structure in which a showerhead and a catalyst wire are separated from each other. This CECVD apparatus maintains good distances between the showerhead, the catalyst wire and the substrate, and prevents contaminants from forming on parts functioning at low temperatures.

A CECVD apparatus according to this embodiment comprises a reaction chamber, a showerhead for introducing reaction gas into the reaction chamber, a catalyst wire for decomposing the gas introduced by the showerhead, a catalyst support for supporting the catalyst wire, a substrate on which the gas decomposed by the catalyst wire is deposited, and a substrate support for supporting the substrate.

In one embodiment of the invention, the catalyst support comprises a gas supply line for supplying gas to the catalyst wire, and a purging gas supply line for purging the inside of the reaction chamber before a reaction.

The distance between the substrate support and the showerhead is adjustable. The distances between the catalyst support and the catalyst wire, the catalyst support and the showerhead and the catalyst support and the substrate support are all adjustable.

The catalyst support comprises a supply unit for supplying gas, and a support unit fitted in the supplying unit. This construction allows the catalyst support to have a variable length while supporting the catalyst wire. The joint between the supply unit and the support unit can be disposed under the substrate support. Further, the supply unit and the support unit can be coupled to each other by any suitable means such that the support unit has a variable length. For example, the supply unit and support unit can be screwed together, fastened together with one or more pins, or held together by air pressure.

In one embodiment of the invention, the reaction gas introduced through the showerhead includes a single gas or a combination gas containing silicon. Nonlimiting examples of suitable reaction gases containing silicon include $SiH_4$ and $SiH_4/H_2$.

According to another embodiment of the invention, the gas supplied to the catalyst wire contains hydrogen. Nonlimiting examples of suitable gases containing hydrogen include $H_2$, $H_2/NH_3$, $NH_3$, and $H_2/SiH_4$.

BRIEF DESCRIPTION OF THE DRAWINGS

These and other features and advantages of the present invention will become more apparent by reference to the following description when considered in conjunction with the accompanying drawings in which.

DETAILED DESCRIPTION

Exemplary embodiments of the present invention will now be described with reference to the accompanying drawings. However, these embodiments are described for illustrative purposes and one of ordinary skill in the art understands that various modifications can be made to the described embodiments.

Figure 3:
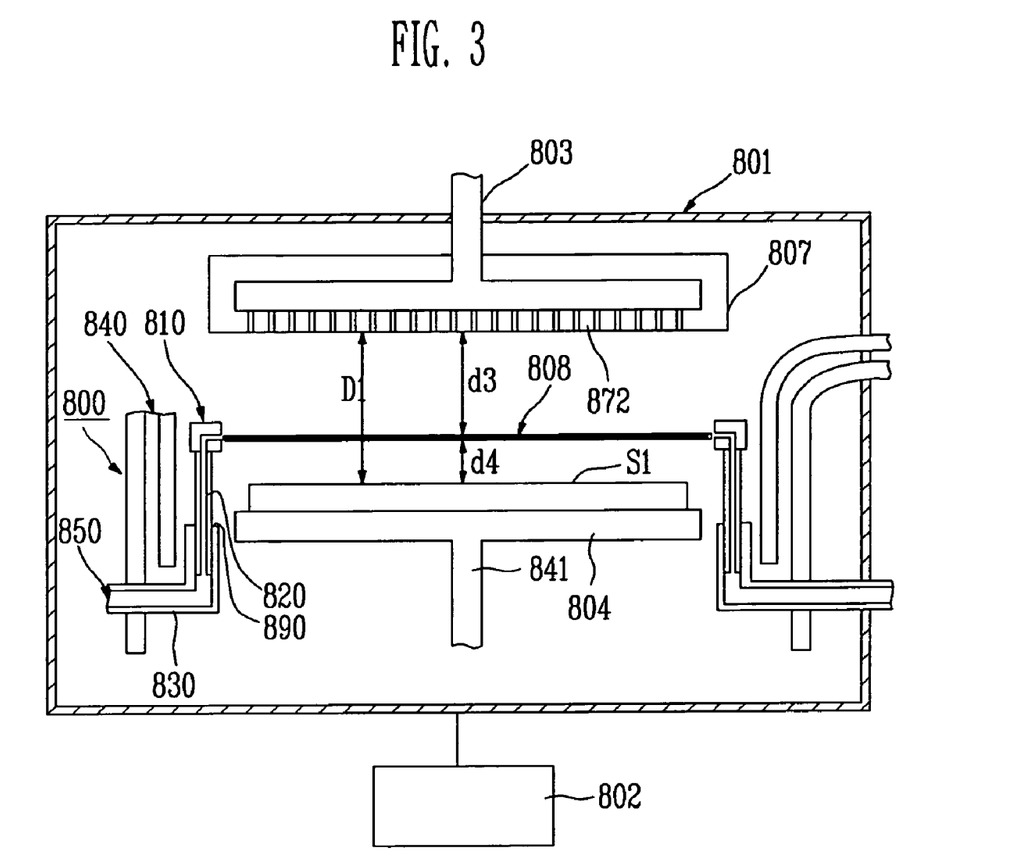
FIG. 3 is a cross-sectional view of a CECVD apparatus according to one embodiment of the present invention.

FIG. 3 is a cross-sectional view of a catalyst enhanced chemical vapor deposition (CECVD) apparatus according to one embodiment of the present invention. The CECVD apparatus includes a catalyst wire, a catalyst support, a substrate support and a showerhead.

The CECVD apparatus includes a reaction chamber 801, a showerhead 807 for introducing reaction gas into the reaction chamber 801, a catalyst wire 808 for decomposing the gas introduced by the showerhead 807, a catalyst support 800 for supporting the catalyst wire 808, a substrate S1 on which the decomposed gas is deposited, and a substrate support 804 for supporting the substrate S1.

In the reaction chamber 801, the showerhead 807 communicates with a gas supply pipe 803 to introduce the gas into the reaction chamber 801. The gas supplied through the gas supply pipe 803 is injected through injection holes 872 in the showerhead 807. The injected gas is then decomposed by the catalyst wire 808, which is spaced apart from the showerhead 807 by a distance d3. The decomposed gas is then deposited on the substrate S1, which is spaced apart from the catalyst wire 808 by a distance d4.

The catalyst support 800 supports the catalyst wire 808 and includes a gas supply line 850 for supplying gas to the catalyst wire 808. The gas supply line 850 extends through the reaction chamber 801 and communicates with a holder 810 for supporting the catalyst wire 808.

Further, the catalyst support 800 includes a purging gas supply line 840 for purging the inside of the reaction chamber 801 before a reaction occurs. Like the gas supply line 850, the purging gas supply line 840 extends through the reaction chamber 801 and communicates with the inside of the reaction chamber 801 via the catalyst support 800.

The substrate support 804 is provided inside the reaction chamber 801 and supports the substrate S1. The substrate support 804 and the showerhead 807 are separated by a distance D1, which is adjustable. The distance D1 can be adjusted by any means suitable in a vacuum system. For example, the distance D1 can be adjusted by moving a supporting shaft 841 connected to the substrate support 804.

Further, the distance d3 between the catalyst wire 808 and the showerhead 807 and the distance d4 between the catalyst wire 808 and the substrate support 804 are also adjustable. The distance d4 between the substrate support 804 and the catalyst wire 808 can be adjusted as described above.

The distance d3 between the catalyst wire 808 and the showerhead 807 is adjusted by the catalyst support 800. The catalyst support 800 includes a supply unit 830 for supplying gas and a support unit 820 fitted in the supply unit 830. This construction provides a catalyst support 800 with a variable length while supporting the catalyst wire 808. In this embodiment, a joint 890 between the support unit 820 and the supply unit 830 is positioned beneath the substrate support 804.

Figure 4A:
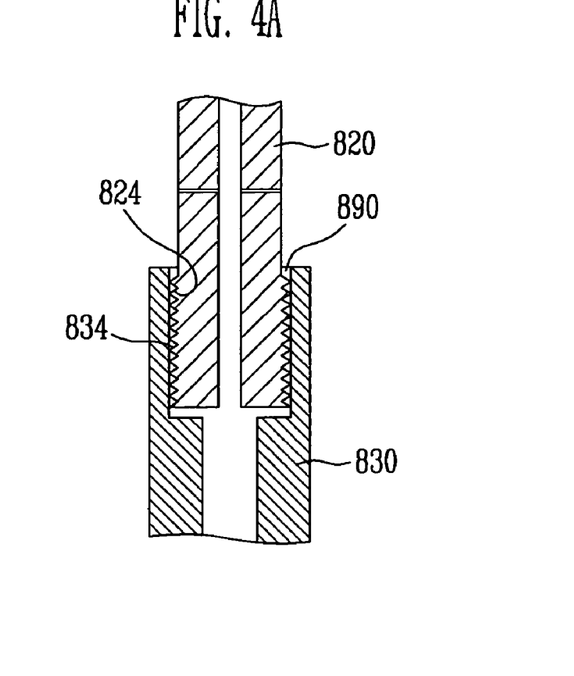
FIG. 4A is a cross-sectional view of the connection of a support unit to a supply unit of a catalyst support according to one embodiment of the present invention.
Figure 4B:
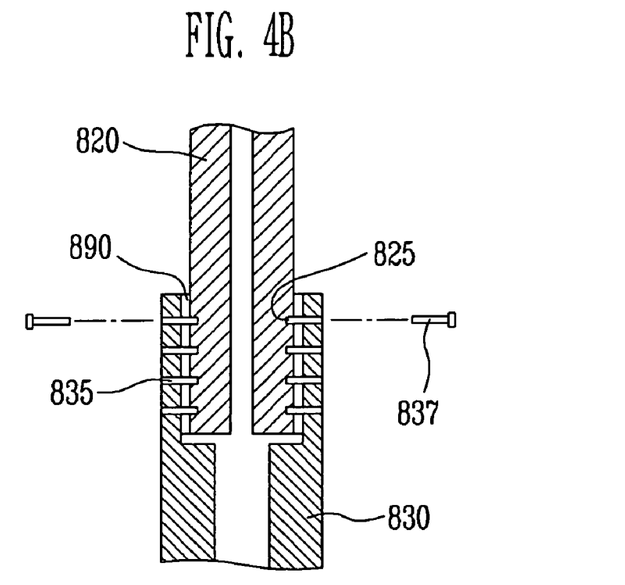
FIG. 4B is a cross-sectional view of the connection of a support unit to a supply unit of a catalyst support according to another embodiment of the present invention.
Figure 4C:
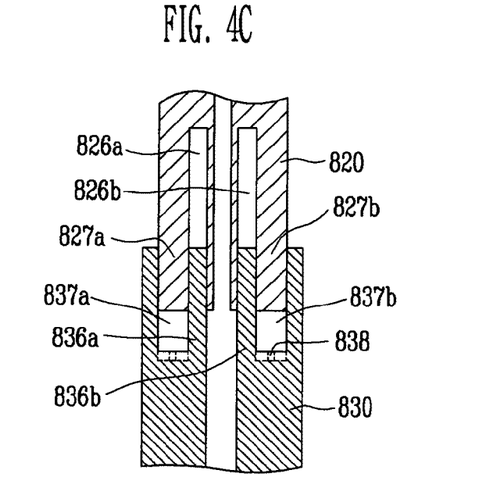
FIG. 4C is a cross-sectional view of the connection of a support unit to a supply unit of a catalyst support according to yet another embodiment of the present invention.

The support unit 820 and supply unit 830 may be coupled together by any suitable means. For example, as shown in FIG. 4A, the support unit 820 and supply unit 830 are screwed together. Alternatively, as shown in FIG. 4B, the support unit 820 and supply unit 830 are held together by one or more pins. In another embodiment, as shown in FIG. 4C, the support unit 820 and supply unit 830 are held together by air pressure. Each of these means for coupling the support unit 820 and supply unit 830 allow the catalyst support 800 to have a variable length.

Referring to FIG. 4A, the support unit 820 and the supply unit 830 can be screwed together. In this embodiment, the support unit 820 is hollow and has a threaded portion 824. The supply unit 830 is also hollow and has a threaded portion 834 adapted to receive the threaded portion 824 of the support unit 820. The threaded portion 824 of the support unit 820 is received by the threaded portion 834 of the supply unit 830 such that the catalyst support 800 has a desired length.

Referring to FIG. 4B, the support unit 820 and the supply unit 830 can be held together by one or more pins. In this embodiment, the support unit 820 is hollow and has a plurality of fastening grooves 825. The supply unit 830 is also hollow and has a plurality of fastening holes 835. The fastening grooves 825 in the support unit 820 and the fastening holes 835 in the supply unit 830 are aligned with each other and a fastening pin 837 is inserted into one of the fastening grooves 825 through a corresponding fastening hole 835 in the supply unit 830 such that the catalyst support 800 has a desired length.

Referring to FIG. 4C, the support unit 820 and the supply unit 830 can be held together by air pressure. In this embodiment, the support unit 820 has first and second concentric hollows 826a and 826b, respectively, each adapted to receive one of a first and second wall 836a and 836b, respectively, of the supply unit 830. Similarly, the supply unit 830 has first and second concentric hollows 837a and 837b, respectively, each adapted to receive one of a first and second wall 827a and 827b, respectively, of the support unit 820. The first concentric hollow 837a of the supply unit 830 receives the first wall 826a of the support unit 820. The first concentric hollow 826a of the support unit 820 receives the first wall 836a of the supply unit 830. Similarly, the second concentric hollow 837b of the supply unit 830 receives the second wall 826b of the support unit 820 and the second concentric hollow 826b of the support unit 820 receives the second wall 836b of the supply unit 830. Further, the second concentric hollow 837b of the supply unit 830 has a gas hole 838 at the bottom of the hollow. Air pressure is applied to the support unit 820 through the gas hole 838. Because the reaction gas may leak during the reaction, the same gas is used for both the reaction and the air pressure. The second hollow 837b of the supply unit 830 may also include a gas discharge hole (not shown) for discharging gas from the second hollow 837b in the event the air pressure inside the second hollow 837b becomes too great. This gas discharge hole maintains a constant air pressure in the second hollow 837b of the supply unit 830 and maintains the catalyst support at the desired length. The air pressure cam be introduced by any suitable means, for example by a solenoid valve or the like.

Figure 5:
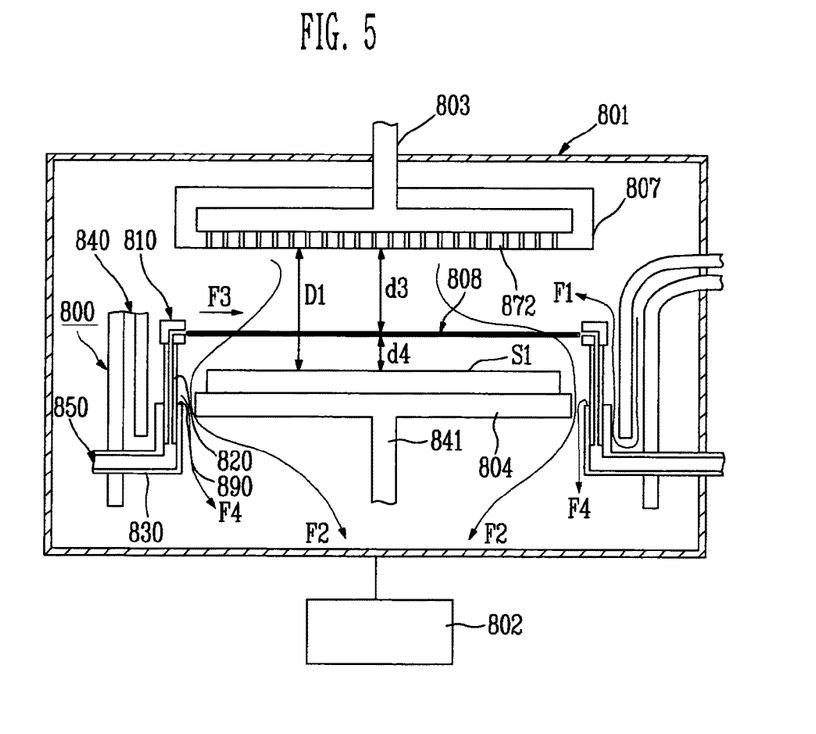
FIG. 5 is a schematic illustrating the flow of gas in a CECVD apparatus according to one embodiment of the present invention.

In a CECVD apparatus according to one embodiment of the present invention, a thin film of Si is deposited on the substrate S1. FIG. 5 is a schematic illustrating the flow of gas during a reaction in the CECVD apparatus according to this embodiment.

As shown in FIG. 5, the distances D1 between the substrate S1 and the showerhead 807, d3 between the showerhead 807 and the catalyst wire 808, and d4 between the catalyst wire 808 and the substrate S1, are adjusted by moving the supporting shaft 841 and the support unit 820. The distance D1 represents the flow of reaction gas directly from the showerhead 807 to the substrate S1 without passing through the catalyst wire 8. The distance d3 represents the flow of reaction gas from the showerhead 807 to the catalyst wire 808. The distance d4 represents the flow of decomposed reaction gas from the catalyst wire 808 to the substrate S1. Each of distances D1, d3 and d4 are important factors in the reaction. In particular, the distance d4 affects the recombination of decomposed gas, the kinetic energy of the decomposed gas, and when the decomposed gas reaches the substrate S1, making it the most important of the distances D1, d3 and d4. When the distance d4 is too short, the substrate S1 may be damaged or the thin film deposited on the substrate S1 may detach due to the heat of the catalyst wire 808, which is heated during the reaction. Thus, adjusting the distances D1, d3 and d4, and using a proper vacuum, improves the reaction.

After adjusting the distances D1, d3 and d4, a vacuum pumping system 802 exhausts the reaction chamber 801 to create a vacuum. Purging gas is then introduced through the purging gas supply line 840 (see "F1" in FIG. 5). After purging the reaction chamber 801, gas containing a silicon base is injected through the showerhead 807 to deposit a thin film of Si onto the substrate S1 (see "F2" in FIG. 5). Gas containing a hydrogen base is then injected to the catalyst wire 808 through the gas supply line 850 (see "F3" in FIG. 5). Heat loss occurs at the point of connection between the catalyst wire 808 and the holder 810 because heat is transferred from the heated catalyst wire 808 to the unheated holder 810. Therefore, contaminants are formed on the catalyst wire 808 as the temperature of the catalyst wire 808 decreases. However, according to one embodiment of the present invention, the gas is injected to the catalyst wire 808 (see "F3" in FIG. 5) so as to prevent the contaminants from forming on the catalyst wire 808.

Although gas may leak from the joint 890 between the supporting unit 820 and the supplying unit 830 of the catalyst support 800 (see "F4" in FIG. 5), the flow of gas resulting from such a leak is much smaller than the flow of reaction gas from the showerhead 807 to the substrate S1 (see "F2" in FIG. 5). In addition, the leaking gas flows under the substrate S1 and the substrate support 804, thereby having very little effect on the reaction.

To deposit a thin film of Si on the substrate S1, the gas introduced by the showerhead 807 contains a silicon base. The gas can be either a single gas or a combination of gases. Nonlimiting examples of suitable gases include $SiH_4$, $SiH_4/H_2$, etc.

Further, the gas supplied to the catalyst wire 808 contains a hydrogen base. Nonlimiting examples of suitable gases having a hydrogen base include $H_2$, $H_2/NH_3$, $NH_3$, $H_2/SiH_4$, etc.

As described above, the CECVD apparatus of the present invention has a simple structure in which a showerhead and a catalyst wire are separated from each other. The apparatus has excellent spacing between the showerhead, catalyst wire and substrate, and can be purged to prevent contaminants from forming on parts functioning at lower temperatures.

Exemplary embodiments of the present invention have been described for illustrative purposes only. Those skilled in the art will appreciate that various modifications, additions and substitutions can be made without departing from the spirit ad scope of the invention as disclosed in the appended claims.

What is claimed is:

1. A catalyst enhanced chemical vapor deposition (CECVD) apparatus comprising:
    a reaction chamber;
    a showerhead for introducing a reaction gas into the reaction chamber;
    a catalyst wire for decomposing the reaction gas;
    a catalyst support for supporting the catalyst wire, the catalyst support comprising:
        a supply unit for supplying a second gas to the catalyst wire; and
        a support unit adapted to fit in the supply unit and to support the catalyst wire, wherein the supply unit and support unit are coaxially engaged such that a distance between the catalyst wire and the supply unit is adjustable;
    a substrate for receiving the reaction gas decomposed by the catalyst wire; and
    a substrate support for supporting the substrate.

2. The CECVD apparatus according to claim 1, wherein the catalyst support further comprises a purging gas supply line for purging the reaction chamber.

3. The CECVD apparatus according to claim 1, wherein a distance between the substrate support and the showerhead is adjustable.

4. The CECVD apparatus according to claim 1, wherein a distance between the catalyst wire and the substrate support is adjustable.

5. The CECVD apparatus according to claim 1, wherein a distance between the catalyst wire and the showerhead is adjustable.

6. The CECVD apparatus according to claim 1, wherein a joint between the supply unit and the support unit is positioned beneath the substrate support.

7. The CECVD apparatus according to claim 1, wherein the supply unit and the support unit are screwed together.

8. The CECVD apparatus according to claim 1, wherein the supply unit and the support unit are held together with one or more pins.

9. The CECVD apparatus according to claim 1, wherein the supply unit and the support unit are held together by air pressure.

10. The CECVD apparatus according to claim 1, wherein the reaction gas introduced by the showerhead comprises a gas containing silicon.

11. The CECVD apparatus according to claim 10, wherein the reaction gas is selected from the group consisting of $SiH_4$ and $SiH_4/H_2$.

12. The CECVD apparatus according to claim 10, wherein the second gas supplied to the catalyst wire contains hydrogen.

13. The CECVD apparatus according to claim 12, wherein the second gas containing hydrogen is selected from the group consisting of $H_2$, $H_2/NH_3$, $NH_3$ and $H_2/SiH_4$.

\* \* \* \* \*